United States Patent
Huang et al.

(10) Patent No.: US 9,384,949 B2
(45) Date of Patent: Jul. 5, 2016

(54) GAS-FLOW CONTROL METHOD FOR PLASMA APPARATUS

(71) Applicant: Taiwan Semiconductor Manufacturing Co., Ltd., Hsin-Chu (TW)

(72) Inventors: Zi-Neng Huang, Taichung (TW); Chang-Sheng Lee, Hsinchu (TW); Shen-Chieh Liu, Taichung (TW); Cherng-Chang Tsuei, Hsinchu (TW)

(73) Assignee: TAIWAN SEMICONDUCTOR MANUFACTURING CO., LTD, Hsin-Chu (TW)

( * ) Notice: Subject to any disclaimer, the term of this patent is extended or adjusted under 35 U.S.C. 154(b) by 0 days.

(21) Appl. No.: 14/455,019

(22) Filed: Aug. 8, 2014

(65) Prior Publication Data

US 2016/0042982 A1    Feb. 11, 2016

(51) Int. Cl.
| | | |
|---|---|---|
| H01J 37/32 | (2006.01) | |
| C23C 16/455 | (2006.01) | |
| H01L 21/3065 | (2006.01) | |
| H01L 21/67 | (2006.01) | |

(52) U.S. Cl.
CPC ..... *H01J 37/32449* (2013.01); *C23C 16/45589* (2013.01); *H01J 37/32623* (2013.01); *H01J 2237/3323* (2013.01); *H01J 2237/3343* (2013.01); *H01L 21/3065* (2013.01); *H01L 21/67069* (2013.01)

(58) Field of Classification Search
None
See application file for complete search history.

(56) References Cited

U.S. PATENT DOCUMENTS

| | | | | |
|---|---|---|---|---|
| 4,798,165 A | * | 1/1989 | deBoer ................. | C23C 16/455 118/715 |
| 2003/0091903 A1 | * | 5/2003 | Sato .................... | H01M 2/1653 429/249 |
| 2004/0031565 A1 | * | 2/2004 | Su ..................... | H01L 21/67017 156/345.33 |
| 2007/0163716 A1 | * | 7/2007 | Hsiao ................ | C23C 16/45565 156/345.26 |
| 2009/0179085 A1 | * | 7/2009 | Carducci ............. | C23C 16/4412 239/289 |
| 2012/0304933 A1 | * | 12/2012 | Mai ................... | C23C 16/45565 118/723 I |
| 2013/0319612 A1 | | 12/2013 | Su et al. | |
| 2015/0214009 A1 | * | 7/2015 | Glukhoy ............ | H01J 37/3244 239/132.3 |
| 2015/0329966 A1 | * | 11/2015 | Shah ................. | C23C 16/45565 118/730 |

* cited by examiner

*Primary Examiner* — Anita Alanko
(74) *Attorney, Agent, or Firm* — McClure, Qualey & Rodack, LLP

(57) ABSTRACT

A gas-flow control method for a plasma apparatus is provided. The gas-flow control method includes mounting a first adjusting mechanism on a gas-distribution plate. The gas-distribution plate includes a number of exhaust openings, and the exhaust openings in a first area of the gas-distribution plate are masked by the first adjusting mechanism. The gas-flow control method also includes exhausting a gas from the exhaust openings in a first unmasked area of the gas-distribution plate, and the gas passing through the first adjusting mechanism into a plasma chamber. The gas-flow control method further includes generating an electric field to excite the gas in the plasma chamber into plasma.

18 Claims, 11 Drawing Sheets

GAS-FLOW CONTROL METHOD FOR PLASMA APPARATUS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a wafer, and patterning the various material layers using lithography to form circuit components and elements thereon. Many integrated circuits are typically manufactured on a single wafer, and individual dies on the wafer are singulated by sawing between the integrated circuits along a scribe line. The individual dies are typically packaged separately, in multi-chip modules, or in other types of packaging, for example.

To selectively form processing layers in a desired location, the processing layers are often deposited, masked, and then etched in unmasked areas using a plasma process.

Although existing devices and methods for plasma processing have been generally adequate for their intended purposes, they have not been entirely satisfactory in all respects. Consequently, it would be desirable to provide a solution for improving the plasma process.

BRIEF DESCRIPTION OF THE DRAWINGS

Aspects of the present disclosure are best understood from the following detailed description when read with the accompanying figures. It is noted that, in accordance with standard practice in the industry, various features are not drawn to scale. In fact, the dimensions of the various features may be arbitrarily increased or reduced for clarity of discussion.

DETAILED DESCRIPTION

Figure 1:
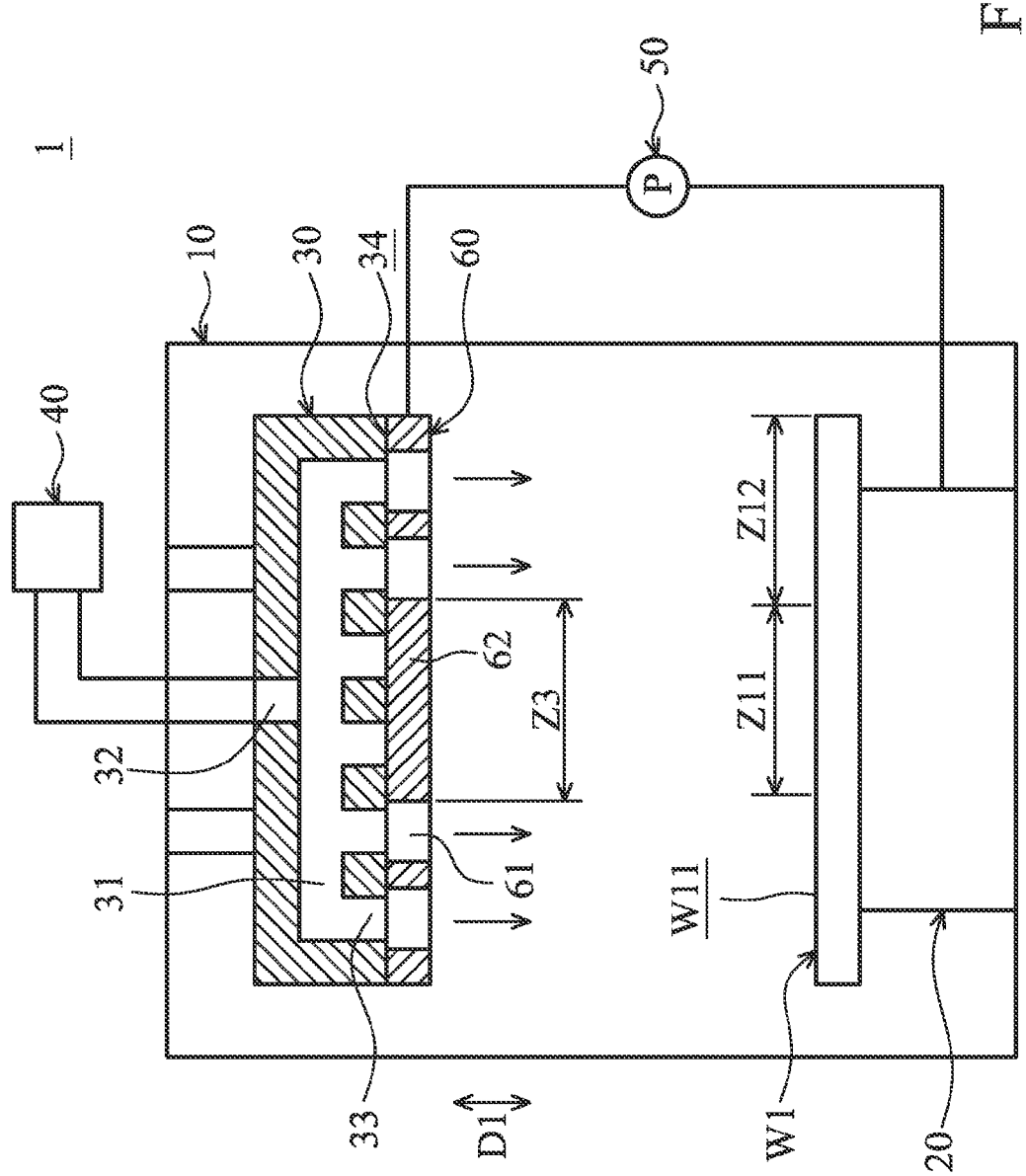
FIG. 1 is a schematic view of a plasma apparatus in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some variations of the embodiments are described. Throughout the various views and illustrative embodiments, like reference numbers are used to designate like elements. It is understood that additional operations can be provided before, during, and after the method, and some of the operations described can be replaced or eliminated for other embodiments of the method.

A plasma apparatus and gas-flow control methods for the plasma apparatus are provided. The distribution of the flow rate of a gas exhausted from a gas-distribution plate is controllable. Therefore, the processing rates, such as etching rates or deposition rates, of different areas of the wafer can be controlled.

FIG. 1 is a schematic view of a plasma apparatus 1 in accordance with some embodiments of the disclosure. The plasma apparatus 1 is configured to perform a semiconductor manufacturing process on a wafer W1. In some embodiments, the semiconductor manufacturing process is an etching process, a physical vapor deposition (PVD) process or a sputtering deposition process.

The plasma apparatus 1 includes a plasma chamber 10, a wafer chuck 20, a gas-distribution plate 30, a gas supply 40, a power supply 50, and an adjusting mechanism 60. The wafer chuck 20 is disposed in the plasma chamber 10. The wafer chuck 20 is configured to retain the wafer W1. In some embodiments, the wafer chuck 20 is an electrostatic wafer chuck.

Figure 2:
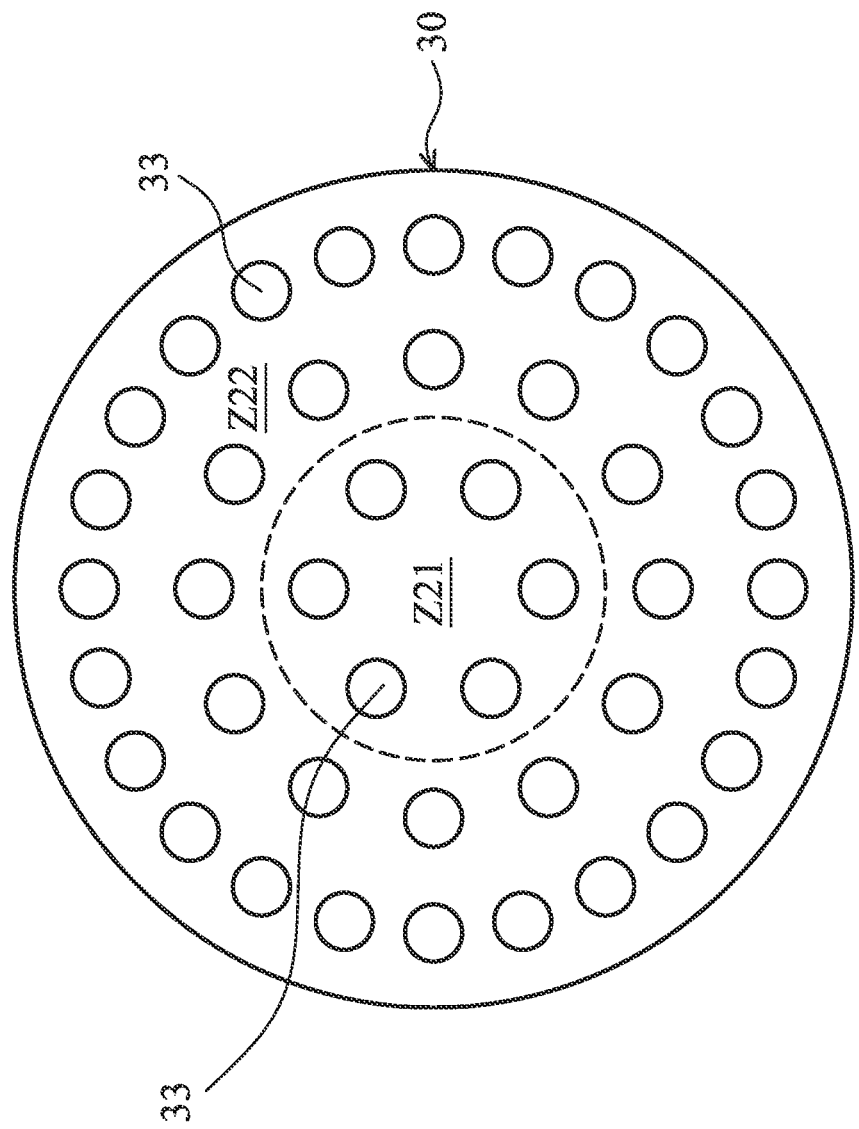
FIG. 2 is a bottom view of the gas-distribution plate in accordance with some embodiments of the disclosure.

FIG. 2 is a bottom view of the gas-distribution plate 30 in accordance with some embodiments of the disclosure. The gas-distribution plate 30 is disposed upon the wafer chuck 20 in the plasma chamber 10. In some embodiments, the gas-distribution plate 30 is parallel to the wafer W1 disposed on the wafer chuck 20.

The gas-distribution plate 30 includes a gas channel 31, an inlet opening 32, and a number of exhaust openings 33. The gas channel 31 is embedded in the gas-distribution plate 30. The inlet opening 32 and the exhaust openings 33 are in communication with the gas channel 31. In some embodiments, the exhaust openings 33 are disposed at the bottom surface 34 of the gas-distribution plate 30 in an array. The exhaust openings 33 are extended along an alignment direction D1.

The gas supply 40 is configured to apply a gas to the gas-distribution plate 30 via the inlet opening 32. In some embodiments, the gas includes $N_2$, Ar, $O_2$, $NH_3$, Ne, or their mixtures. When the gas supply 40 applies the gas to the gas-distribution plate 30, the gas flows into the gas channel 31 via the inlet opening 32. Afterward, the gas is exhausted from the exhaust openings 33 into the plasma chamber 10 in the alignment direction D1.

The power supply 50 is electrically connected to the wafer chuck 20 and the gas-distribution plate 30. In some embodiments, the wafer chuck 20 and the gas-distribution plate 30 serve as electrodes of the power supply 50. When the power supply 50 applies power to the wafer chuck 20 and the gas-distribution plate 30, an electric field is generated between the wafer chuck 20 and the gas-distribution plate 30 in the plasma chamber 10 by the wafer chuck 20 and the gas-distribution plate 30.

In some embodiments, the power supply 50 is electrically connected to the wafer chuck 20 and the adjusting mechanism 60. The wafer chuck 20 and the adjusting mechanism 60 serve as electrodes of the power supply 50. When the power supply 50 applies power to the wafer chuck 20 and the adjusting mechanism 60, an electric field is generated between the wafer chuck 20 and the adjusting mechanism 60 in the plasma chamber 10 by the wafer chuck 20 and the adjusting mechanism 60.

In some embodiments, the adjusting mechanism 60 is detached from the gas-distribution plate 30. During a semiconductor manufacturing process, the wafer W1 is retained by the wafer chuck 20. The gas supply 40 applies the gas to the gas-distribution plate 30. The gas is exhausted from the exhaust openings 33 of the gas-distribution plate 30, and flows downward to the wafer W1. The power supply 50 applies power to the wafer chuck 20 and the gas-distribution plate 30 (or the adjusting mechanism 60) to generate the electric field. Afterward, the gas between the wafer chuck 20 and the gas-distribution plate 30 is excited to plasma. The wafer W1 is etched or deposited by the plasma.

However, after the semiconductor manufacturing process, the profile of the top surface W11 of the wafer W1 may be uneven. In some embodiments, for example, the average thickness of the center area Z11 of the wafer W1 is thinner than the average thickness of the edge area Z12 of the wafer W1. As a result, the average thickness of the area Z11 of the wafer W1 may be lower than the request thickness. The yield rate of the dies at the area Z11 of the wafer W1 may be decreased. Accordingly, the adjusting mechanism 60 is utilized to adjust the processing rate of the area Z11 of the wafer W1.

In some embodiments, as shown in FIG. 1, the adjusting mechanism 60 is located between the wafer chuck 20 and the gas-distribution plate 30. The adjusting mechanism 60 is mounted on the gas-distribution plate 30. In some embodiments, the adjusting mechanism 60 is detachably mounted on the bottom surface 34 of the gas-distribution plate 30. In some embodiments, the adjusting mechanism 60 is directly connected to the bottom surface 34 of the gas-distribution plate 30. In some embodiments, the adjusting mechanism 60 is close to and distant from the bottom surface 34 of the gas-distribution plate 30.

Figure 3A:
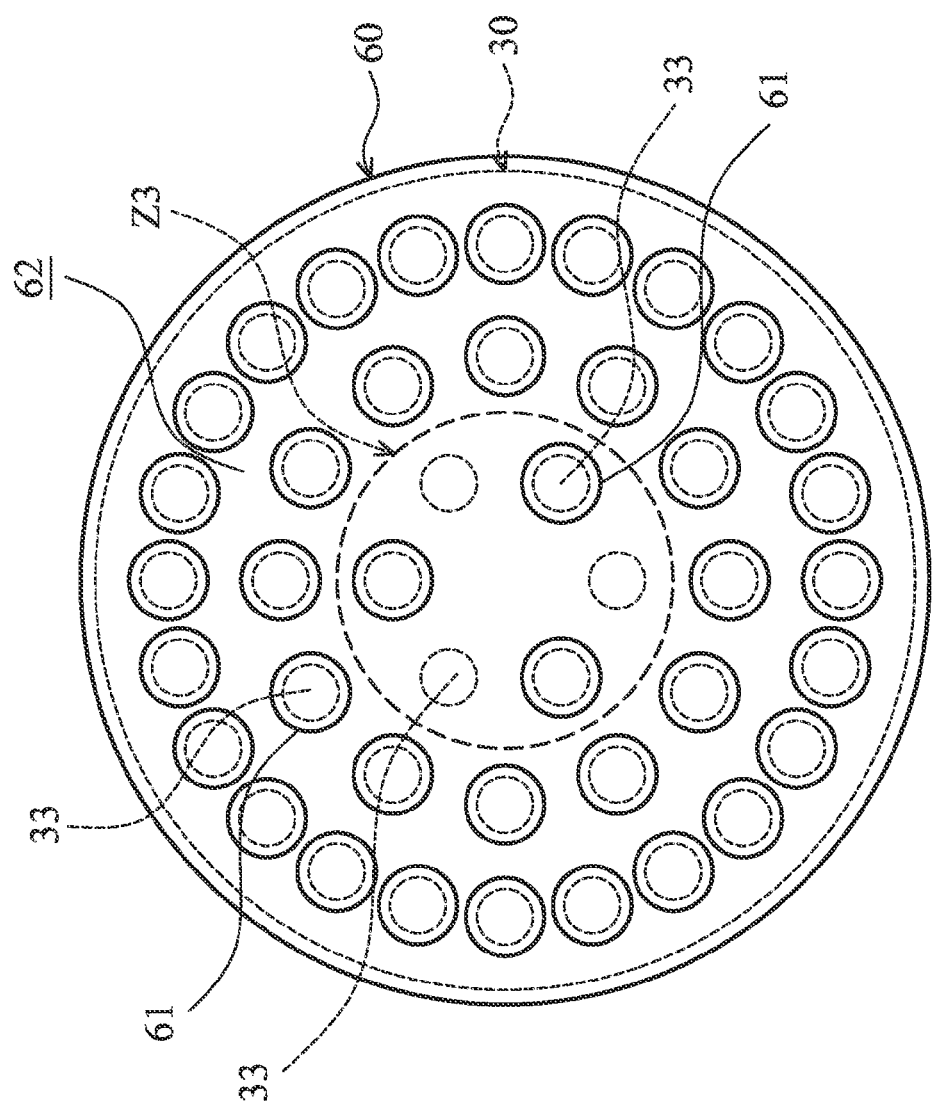
FIGS. 3A and 3B are bottom views of the adjusting mechanism in accordance with some embodiments of the disclosure.

FIG. 3A is a bottom view of the adjusting mechanism 60 in accordance with some embodiments of the disclosure. In some embodiments, as shown in FIG. 3A, the adjusting mechanism 60 is a disk structure. The adjusting mechanism 60 has a number of through holes 61. The through holes 61 are extended along the alignment direction D1 as shown in FIG. 1. The gas exhausted from the exhaust openings 33 flows through the through holes 61.

The through holes 61 are disposed at the main surface 62 of the adjusting mechanism 60 in an array. As shown in FIG. 2, some of the exhaust openings 33 of the gas-distribution plate 30 are located in a masked area Z21, and some of the exhaust openings 33 are located in an unmasked area Z22. Each of the through holes 61 corresponds to one of the exhaust openings 33 in the masked area Z21 or the unmasked area Z22.

In some embodiments, the diameter of each of the through holes 61 is substantially equal to or greater than the diameter of each of the exhaust openings 33. The density of distribution of the through holes 61 in a masking area Z3 at the main surface 62 is lower than the density of distribution of the through holes 61 out of the masking area Z3 at the main surface 62. The masking area Z3 corresponds to the masked area Z21, and configured to mask the exhaust openings 33 in the masking area Z21. In other words, some of the exhaust openings 33 in the masked area Z21 are masked by the masking area Z3 at the alignment direction D1.

Consequently, the flow rate of the gas exhausted from the adjusting mechanism 60 in the masking area Z3 is lower than the flow rate of the gas exhausted from the adjusting mechanism 60 out of the masking area Z3. As a result, the etching degree or the deposition degree of the area Z11, which faces the masking area Z3 at the alignment direction D1, of the wafer W1 is modified by the adjusting mechanism 60.

Since the flow rate of the gas exhausted from the masking area Z3 is lower, the processing rate of the wafer W1 in the area Z11 corresponding to the masking area Z3 at the alignment direction D1 is lower. Consequently, the average thickness of the area Z11 of the wafer W1 is modified after the semiconductor manufacturing process due to the adjusting mechanism 60.

In some embodiments, as shown in FIG. 3A, the masking area Z3 is at the center of the adjusting mechanism 60. Therefore, the average thickness of the center area Z11 of the wafer W1 with the adjusting mechanism 60 is thicker than the average thickness of the center area Z11 of the wafer W1 without the adjusting mechanism 60 after the semiconductor manufacturing process. As a result, the yield rate of the dies at the area Z11 of the wafer W1 is improved.

Figure 3B:
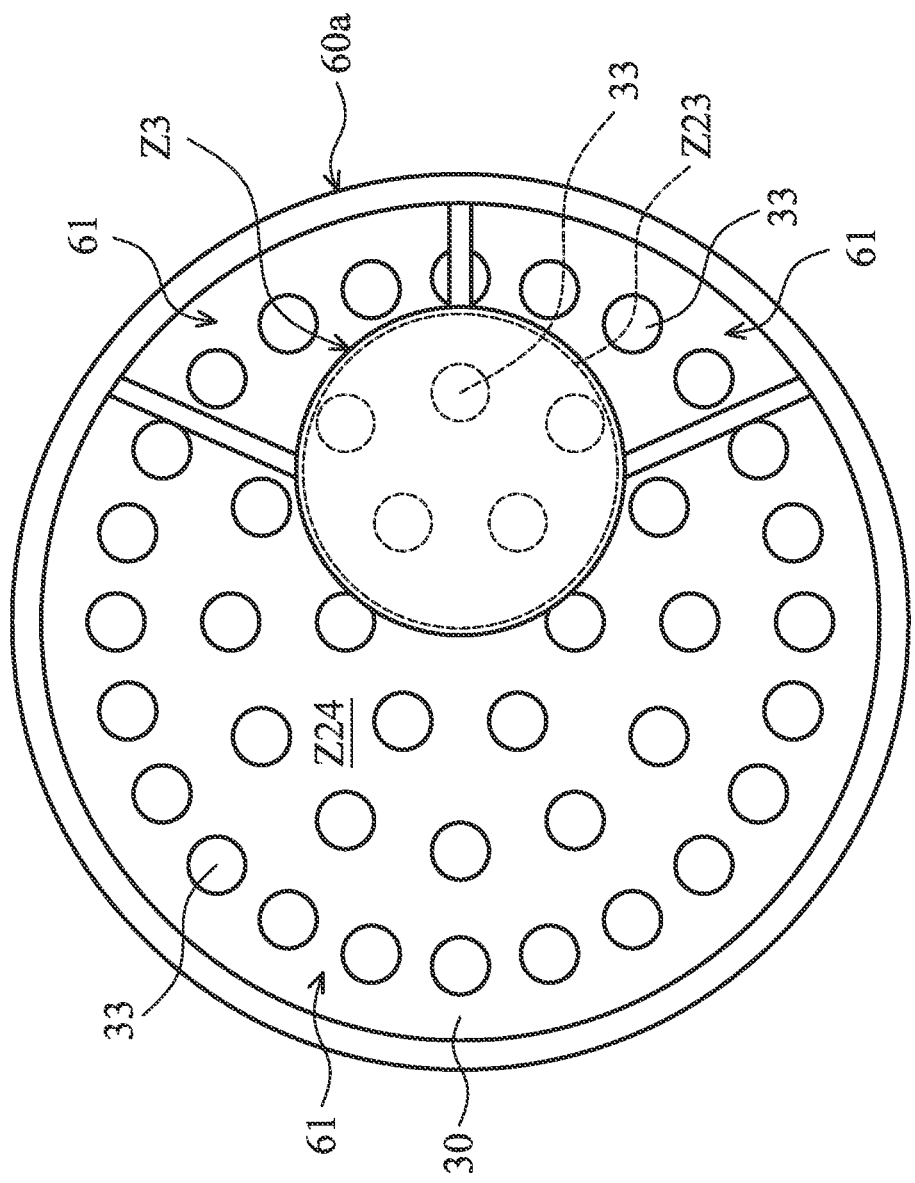

FIG. 3B is a bottom view of the adjusting mechanism 60a in accordance with some embodiments of the disclosure. In some embodiments, as shown in FIG. 3B, the masking area Z3 is close to the edge of the adjusting mechanism 60a. The through hole 61 is excluded in the masking area Z3. Therefore, the exhaust openings 33 in a masked area Z23 corresponding to the masking area Z3 are masked at the alignment direction D1. The flow rate of the gas exhausted from of the adjusting mechanism 60a in the masking area Z3 is greatly decreased.

In some embodiments, the through hole 61 corresponds to a number of exhaust openings 33 in the unmasked area Z24 at the alignment direction D1. Therefore, the flow rate of the gas caused by the through hole 61 is further decreased.

Figure 4:
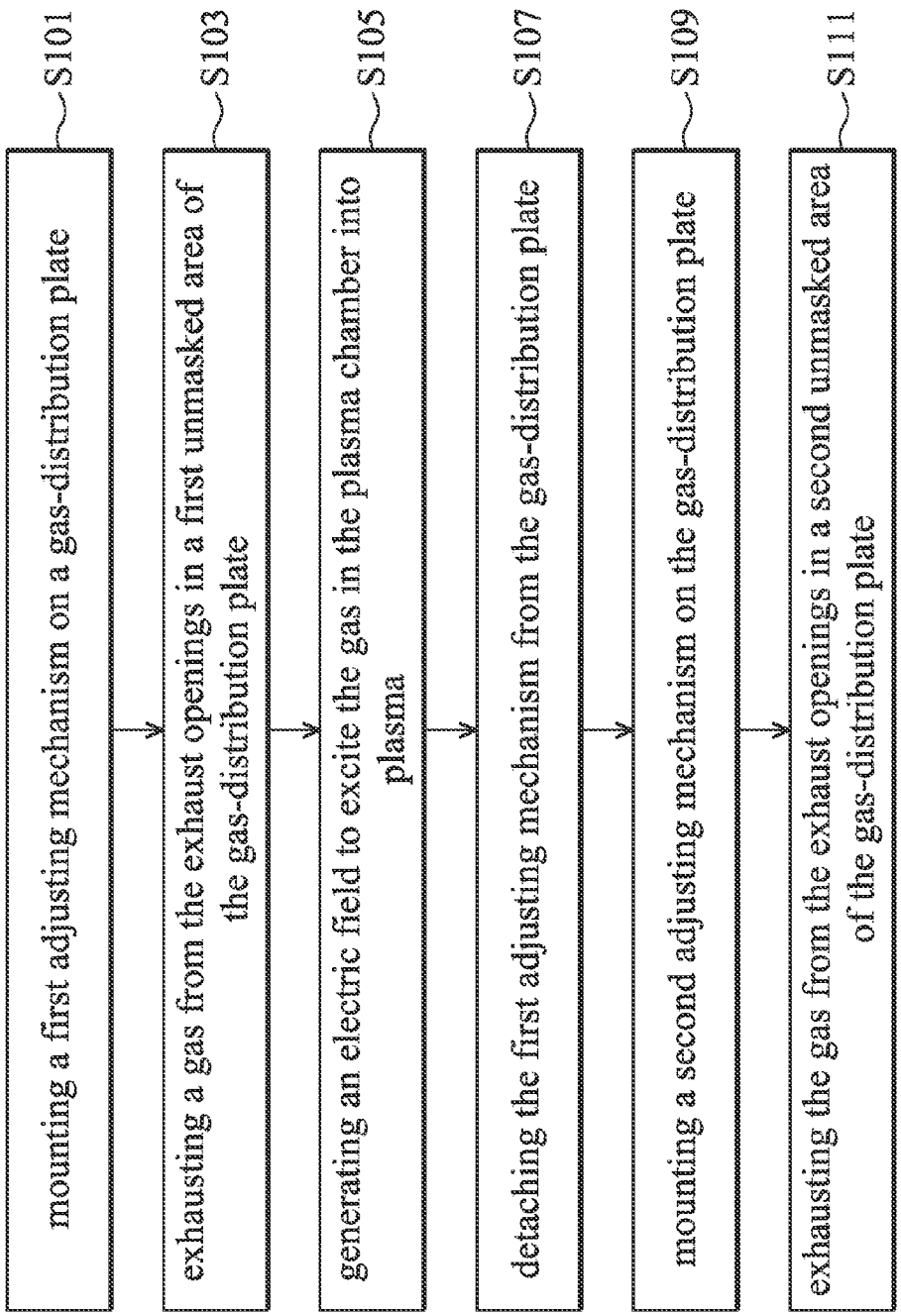
FIG. 4 is a flow chart of a gas-flow control method for the plasma apparatus in accordance with some embodiments of the disclosure.

FIG. 4 is a flow chart of a gas-flow control method for the plasma apparatus 1 in accordance with some embodiments of the disclosure. In step S101, the adjusting mechanism (first adjusting mechanism) 60 is mounted on the gas-distribution plate 30. The exhaust openings 33 in the area (first area) Z21 of the gas-distribution plate 30 are masked by the adjusting mechanism 60.

In step S103, a plasma process is processed. The wafer W1 is disposed at the wafer chuck 20. The gas supply 40 applies the gas to the gas-distribution plate 30. The gas is exhausted from the exhaust openings 33 in the unmasked area (first unmasked area) Z22 of the gas-distribution plate 30, and afterward the gas passes through the adjusting mechanism 60 into the plasma chamber 10.

In step S105, the power supply 50 is enabled. An electric field is generated by the wafer chuck 20 and the gas-distribution plate 30 (or the adjusting mechanism 60) to excite the gas in the plasma chamber 10 into plasma. Afterward, the wafer W1 is processed by the plasma.

In some embodiments, the distribution of the gas flow of the gas exhausted from the gas-distribution plate 30 can be adjusted during the plasma process. After a period of a processing time in step S105, the adjusting mechanism 60 can be replaced by another adjusting mechanism. For example, the adjusting mechanism 60 in FIG. 3A is replaced by the adjusting mechanism (second adjusting mechanism) 60a in FIG. 3B.

In step S107, the first adjusting mechanism 60 is detached from the gas-distribution plate 30. In some embodiments, the first adjusting mechanism 60 is detached by a robot arm (not shown).

In step S109, a second adjusting mechanism 60a is mounted on the gas-distribution plate 30. In some embodiments, the second adjusting mechanism 60a is mounted on the gas-distribution plate 30 by the robot arm. Therefore, the exhaust openings 33 in the second area Z23 of the gas-distribution plate are masked by the second adjusting mechanism 60a. The second area Z23 of the second adjusting mechanism 60a is different from the first area Z21 of the first adjusting mechanism 60. In some embodiments, the steps S107 and S109 are processed during the plasma process.

In step S111, the gas is exhausted from the exhaust openings 33 in the second unmasked area Z24 of the gas-distribution plate 30. The second unmasked area Z24 is different from the first unmasked area Z22 in step S103, and afterward the gas passes through the second adjusting mechanism 60a into the plasma chamber 10. For example, as shown in FIG. 1, the processing rate of an area Z12 facing the second area Z23 is modified. The average thickness of the wafer W1 is further improved.

Figure 5:
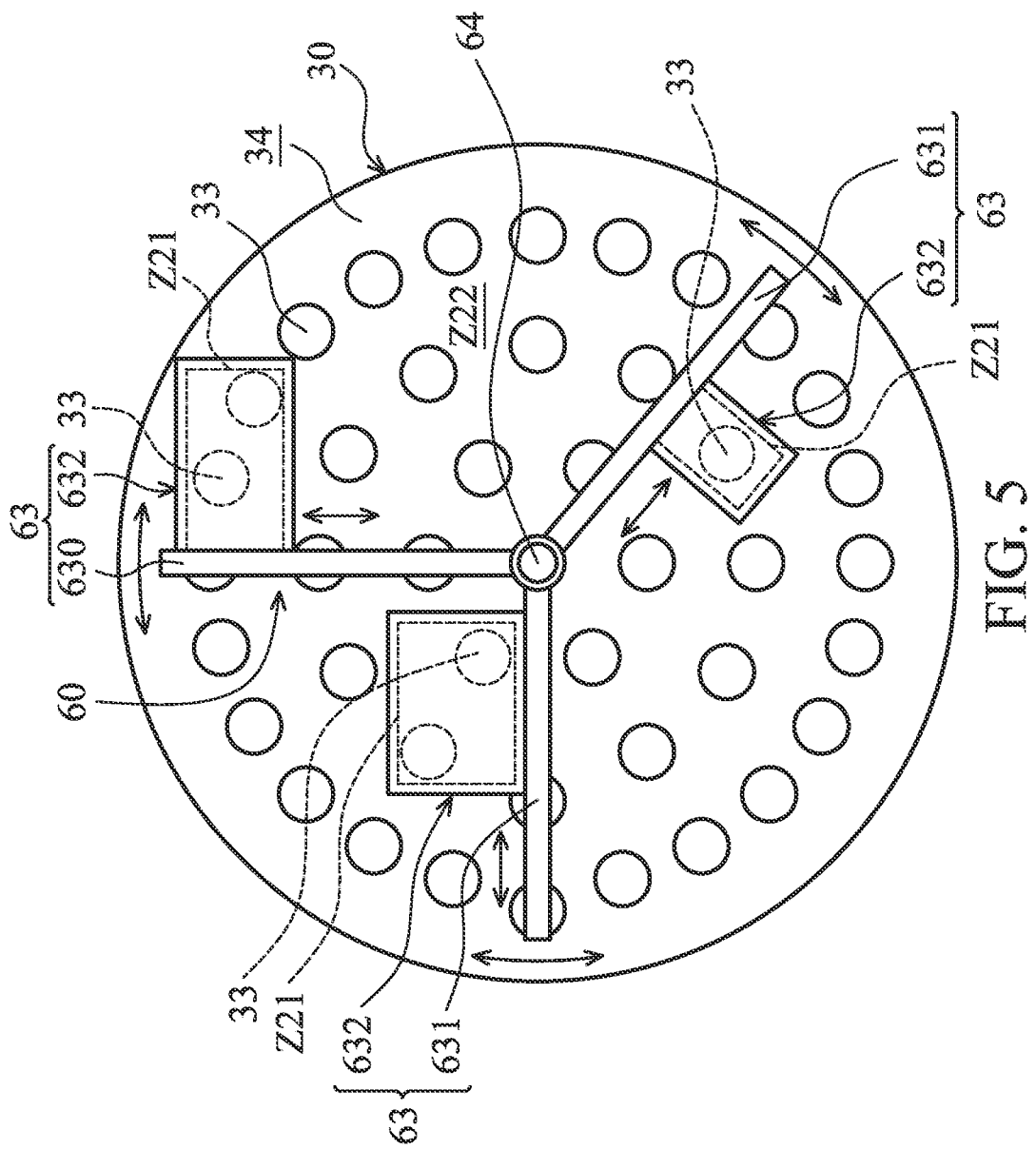
FIG. 5 is a bottom view of the adjusting mechanism and the gas-distribution plate in accordance with some embodiments of the disclosure.

FIG. 5 is a bottom view of the gas-distribution plate 30 and the adjusting mechanism 60 in accordance with some embodiments of the disclosure. In some embodiments, the adjusting mechanism 60 is mounted on the bottom surface 34 of the gas-distribution plate 30. The adjusting mechanism 60 includes a number of masking elements 63. Each of the masking elements 63 is configured to mask some of the exhaust openings 33. In some embodiments, the masking elements 63 are plate structures. The masking elements 63 can be rotated or moved in a plane, which is parallel to the gas-distribution plate 30.

In some embodiments, the adjusting mechanism 60 further includes a shaft 64. The shaft 64 is detachably disposed at the center of the gas-distribution plate 30. Each of the masking elements 63 has an arm 631 and a masking piece 632. One end of the arm 631 pivots at the shaft 64. In some embodiments, the shaft 64 is perpendicular to the gas-distribution plate 30. In some embodiments, the arm 631 is located in a plane, which is parallel to the gas-distribution plate 30.

The masking piece 632 is slidably disposed at a side of the arm 631. The masking piece 632 is configured to mask some of the exhaust openings 33. In some embodiments, the masking piece 632 is located in a plane, which is parallel to or inclined to the gas-distribution plate 30. In some embodiments, the area of one of masking pieces 632 is different from or equal to the area of another masking piece 632. The width of each of the masking pieces 632 is greater than the width of the arm 631.

As show in FIG. 5, each of the arms 631 can be rotated about the shaft 64. Each of the masking pieces 632 can be moved along the arm 631. Therefore, the assigned exhaust openings 33 of the gas-distribution plate 30 can be masked by moving the masking pieces 632 and rotating the arm 631.

In some embodiments, the arm 631 and the masking piece 632 are formed as a single piece. The masking piece 632 extends from the side of the arm 631. The distances between each of the masking pieces 632 and the shaft 64 may be different or the same.

Figure 6A:
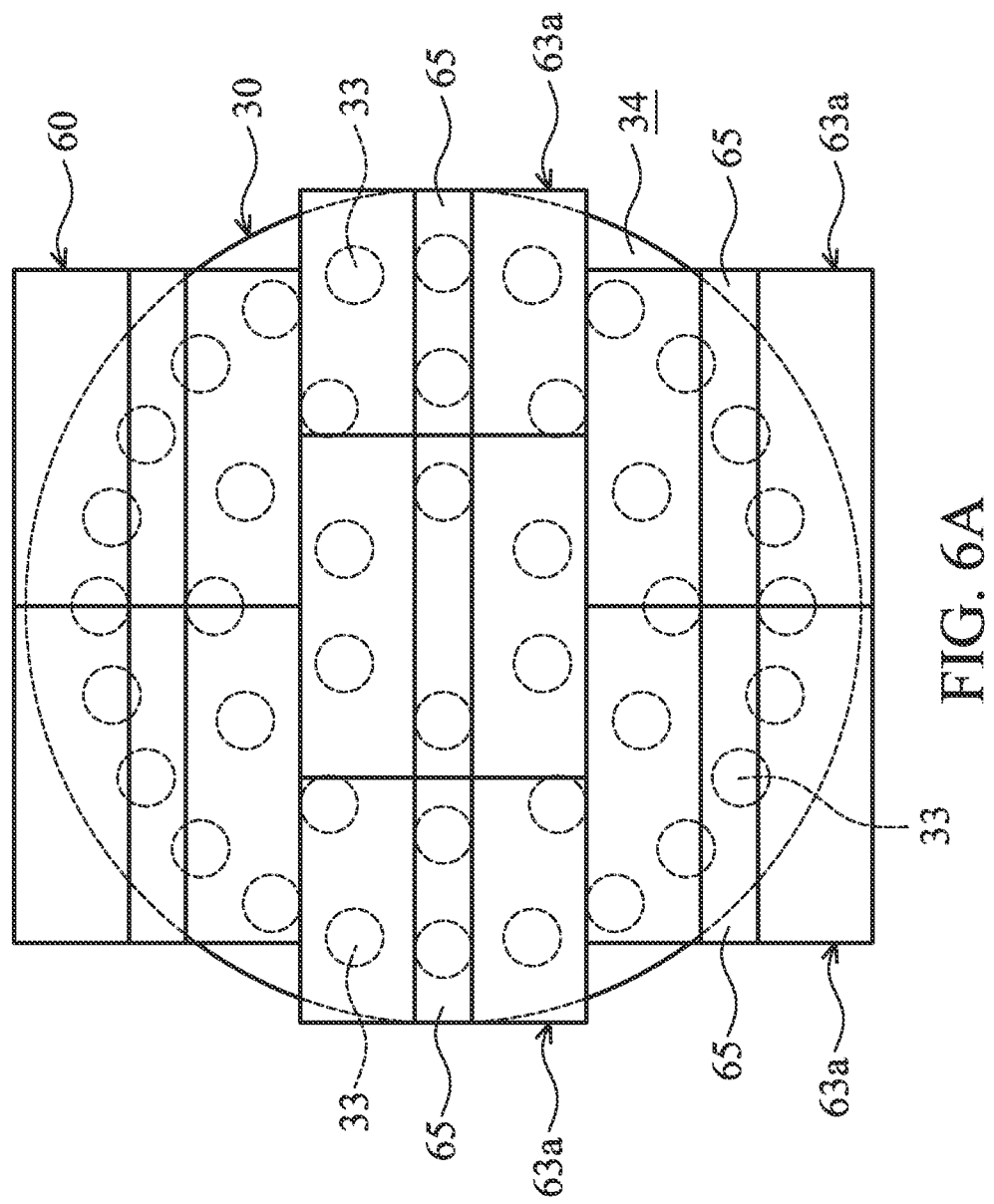
FIG. 6A is a top view of the adjusting mechanism and the gas-distribution plate in accordance with some embodiments of the disclosure.
Figure 6B:
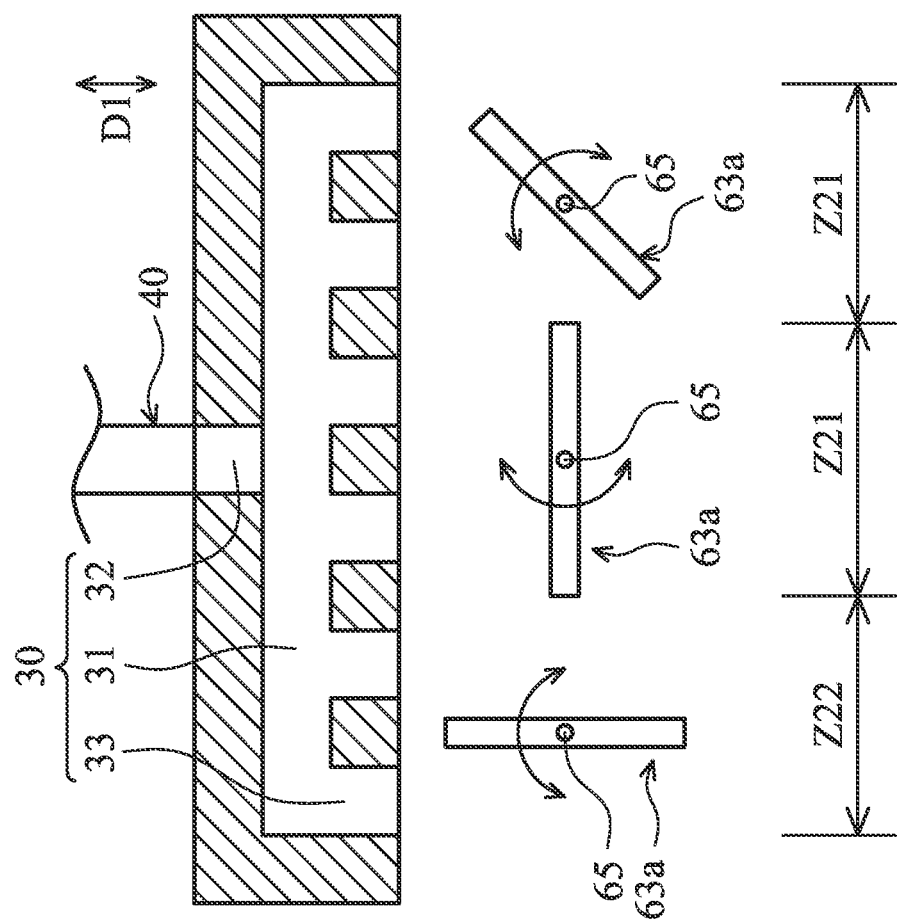
FIG. 6B is a cross-sectional view of the adjusting mechanism and the gas-distribution plate in accordance with some embodiments of the disclosure.

FIG. 6A is a top view of the gas-distribution plate 30 and the adjusting mechanism 60 in accordance with some embodiments of the disclosure. FIG. 6B is a cross-sectional view of the gas-distribution plate 30 and the adjusting mechanism 60 in accordance with some embodiments of the disclosure. In some embodiments, the adjusting mechanism 60 is disposed on the bottom surface 34 of the gas-distribution plate 30.

The adjusting mechanism 60 includes a number of masking elements 63a and a number of rotation axes 65. The masking elements 63a are arranged on the bottom surface 34 of the gas-distribution plate 30 the in an array. Each of the masking elements 63a is rotated about one of the rotation axes 65. In some embodiments, the rotation axes 65 are parallel to the gas-distribution plate 30.

As shown in FIG. 6B, when the masking elements 63 are parallel to or inclined to the gas-distribution plate 30, the masking elements 63 masks the exhaust openings 33 in the masked area Z21 at the alignment direction D1. When the masking element 63 is perpendicular to the gas-distribution plate 30, the masking element 63 does not mask the exhaust openings 33 in the unmasked area Z22 at the alignment direction D1 in general.

Figure 7:
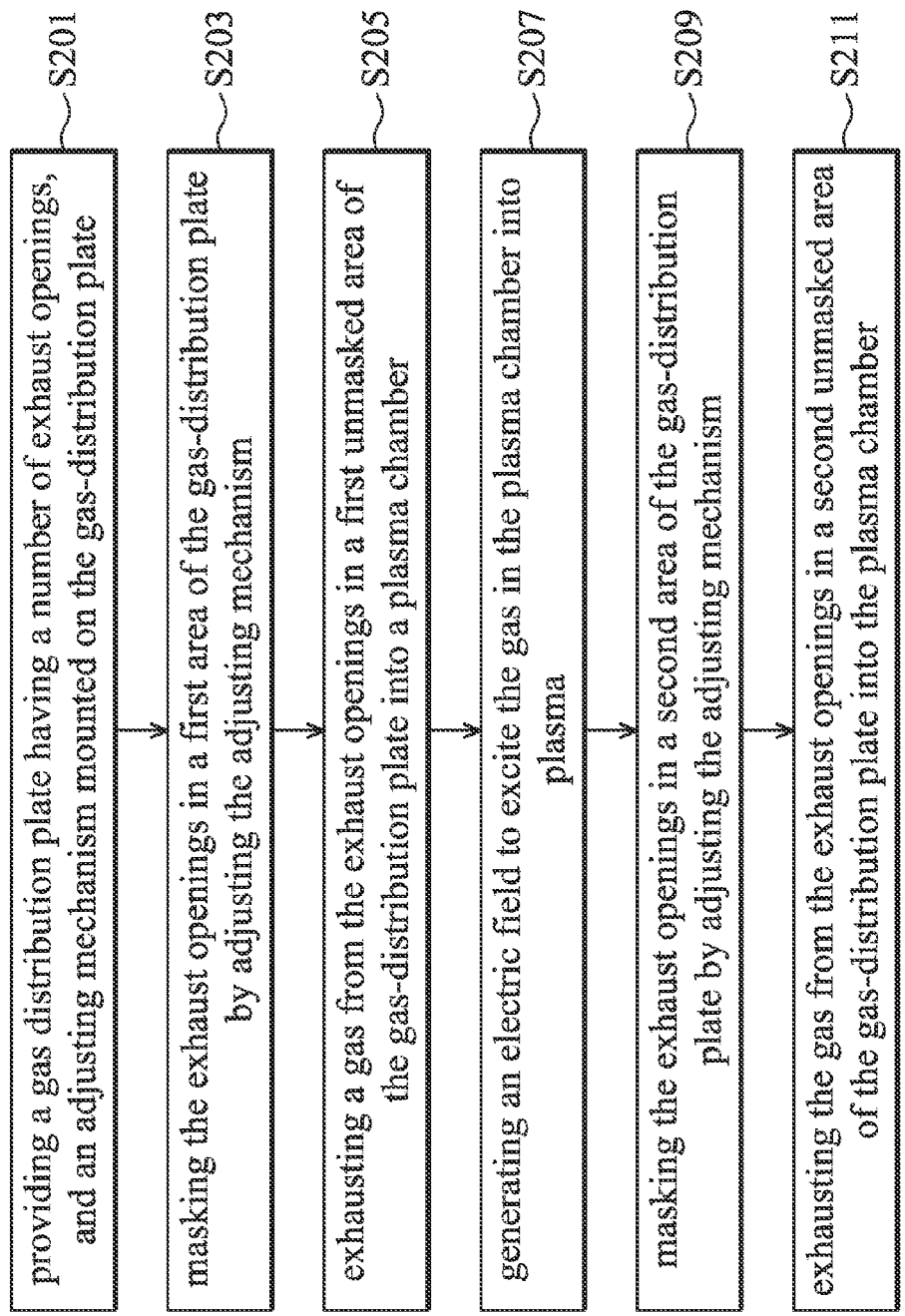
FIG. 7 is a flow chart of a gas-flow control method for the plasma apparatus in accordance with some embodiments of the disclosure.

FIG. 7 is a flow chart of a gas-flow control method for the plasma apparatus 1 in accordance with some embodiments of the disclosure. In step S201, the gas-distribution plate 30 is provided, and the adjusting mechanism 60 is mounted on the gas-distribution plate 30.

In step S203, the adjusting mechanism 60 is adjusted to mask the exhaust openings 33 in first areas Z21 of the gas-distribution plate 30. In some embodiments, the adjusting mechanism 60 is adjusting by a driving mechanism.

In some embodiments, as shown in FIG. 5, the masking element 63 is rotated by the driving mechanism. The arms 631 are rotated and the masking pieces 632 are moved along the arms 631 to mask the exhaust openings 33 in first areas Z21. In some embodiments, as shown in FIGS. 6A and 6B, the masking elements 63a are rotated about the rotation axes 65 to a horizontal position by the driving mechanism, to mask the exhaust openings 33 in first areas Z21.

In step S205, a plasma process is processed. The wafer W1 is disposed at the wafer chuck 20. The gas supply 40 applies the gas to the gas-distribution plate 30. The gas is exhausted from the exhaust openings 33 in first unmasked areas Z22 of the gas-distribution plate 30 into the plasma chamber 10.

In step S207, the power supply 50 is enabled. An electric field is generated by the wafer chuck 20 and the gas-distribution plate 30 (or the adjusting mechanism 60) to excite the gas in the plasma chamber 10 into plasma. Afterward, the wafer W1 is processed by the plasma.

In some embodiments, the distribution of the gas flow of the gas exhausted from the gas-distribution plate 30 can be adjusted during the plasma process. After a period of a processing time in step S207, the adjusting mechanism 60 can be adjusted during the plasma process.

In step S209, the exhaust openings 33 in second areas, which are different from the first areas Z21, of the gas-distribution plate 30 are masked by adjusting the adjusting mechanism 60.

In some embodiments, as shown in FIG. 5, the masking elements 63 are rotated to mask second areas, which is different from the first area Z21. In some embodiments, as shown in FIGS. 6A and 6B, some of the masking elements 63 are rotated from a horizontal position to a vertical position, and the masking elements 63 are rotated from a vertical position to a horizontal position. Therefore, the masked area of the gas-distribution plate 30 can be easily changed by the adjusting mechanism 60.

In step S211, the gas is exhausted from the exhaust openings 33 in a second unmasked area, which is different from the first unmasked area Z22 in step S205, of the gas-distribution plate 30. For example, as shown in FIG. 1, the processing rate of an area Z12, different from the area Z11, of the wafer W1 is modified. The average thickness of the wafer W1 is further improved.

Figure 8:
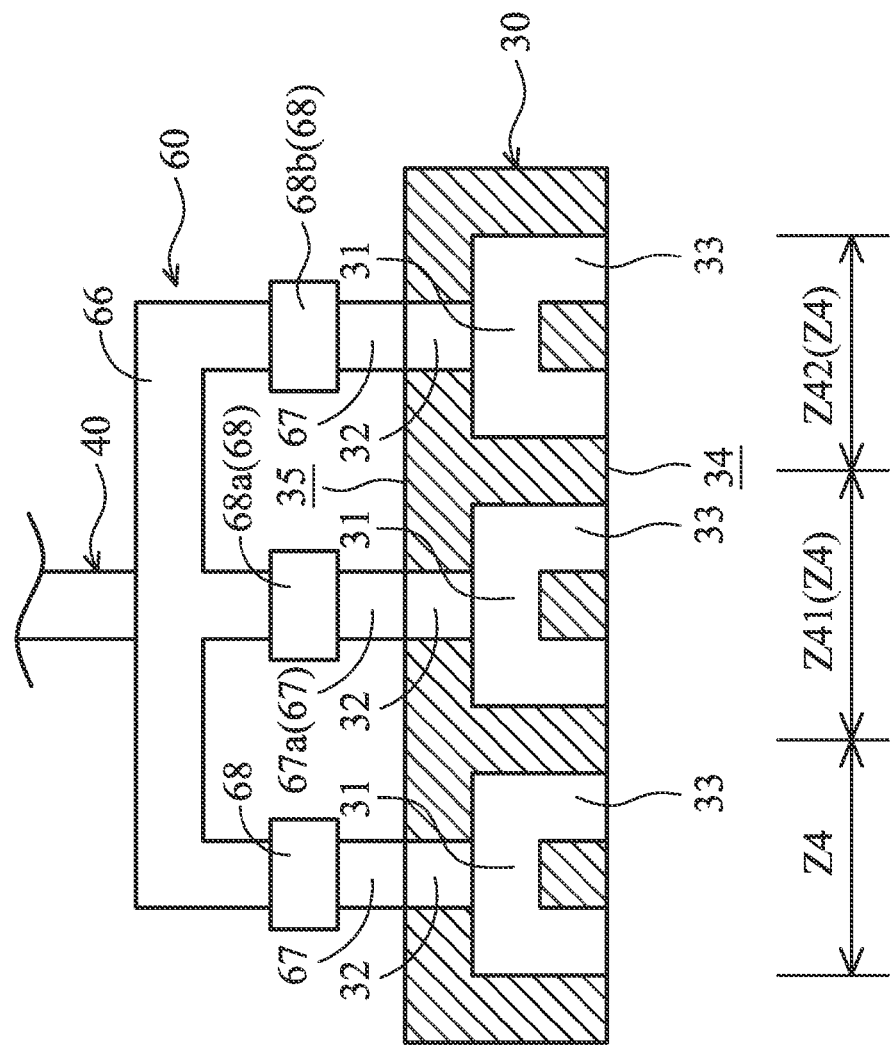
FIG. 8 is a cross-sectional view of the adjusting mechanism and the gas-distribution plate in accordance with some embodiments of the disclosure.

FIG. 8 is a cross-sectional view of the gas-distribution plate 30 and the adjusting mechanism 60 in accordance with some embodiments of the disclosure. In some embodiments, the gas-distribution plate 30 includes a number of areas Z4. Each of areas Z4 has one gas channel 31, an inlet opening 32, and a number of exhaust openings 33. The gas channel 31 is in communication with the inlet opening 32 and the exhaust openings 33 in the same area Z4. In other words, the gas channels 31 in different areas Z4 are independent to each other in the gas-distribution plate 30.

The adjusting mechanism 60 is mounted on a top surface 35 of the gas-distribution plate 30. The adjusting mechanism 60 includes a main channel 66, a number of sub-channels 67, and a number of valves 68. The main channel 66 is in communication with the sub-channels 67 and the gas supply 40. Each of the sub-channels 67 is communicated with one of the inlet openings 32.

Each of the valves 68 is disposed at one of the sub-channels 67. The flow rate of the gas is set by adjusting the valves 68. The valves 68 are configured to adjust the flow rate of the gas in the sub-channels 67 and the exhaust openings 33 of the area Z1 corresponding to the sub-channel 67.

In some embodiments, the gas supply 40 applies the gas into the main channel 66 of the adjusting mechanism 60. The gas in the main channel 66 flows into the inlet openings 32 via the sub-channels 67. Afterward, the gas is exhausted from the exhaust openings 33 via the gas channel 31.

As shown in FIG. 8, for example, when the flow rate of the gas in the sub-channel 67a is decreased by adjusting the valve 68a, the flow rate of the gas exhausted from the exhaust openings 33 in the area Z41 is decreased. Therefore, since the flow rate of the gas exhausted from the exhaust openings 33 in the area Z41 is lower, the processing rate of the wafer W1 in the area Z11 under the area Z41 is lower.

In some embodiments, since the flow rate of the gas in the sub-channel 67a is increased by adjusting the valve 68a, the flow rate of the gas exhausted from the exhaust openings 33 in the area Z41 is increased. Therefore, since the flow rate of the gas exhausted from the exhaust openings 33 in the area Z41 is greater, the processing rate of the wafer W1 in the area Z11 under the area Z41 is greater.

Figure 9:
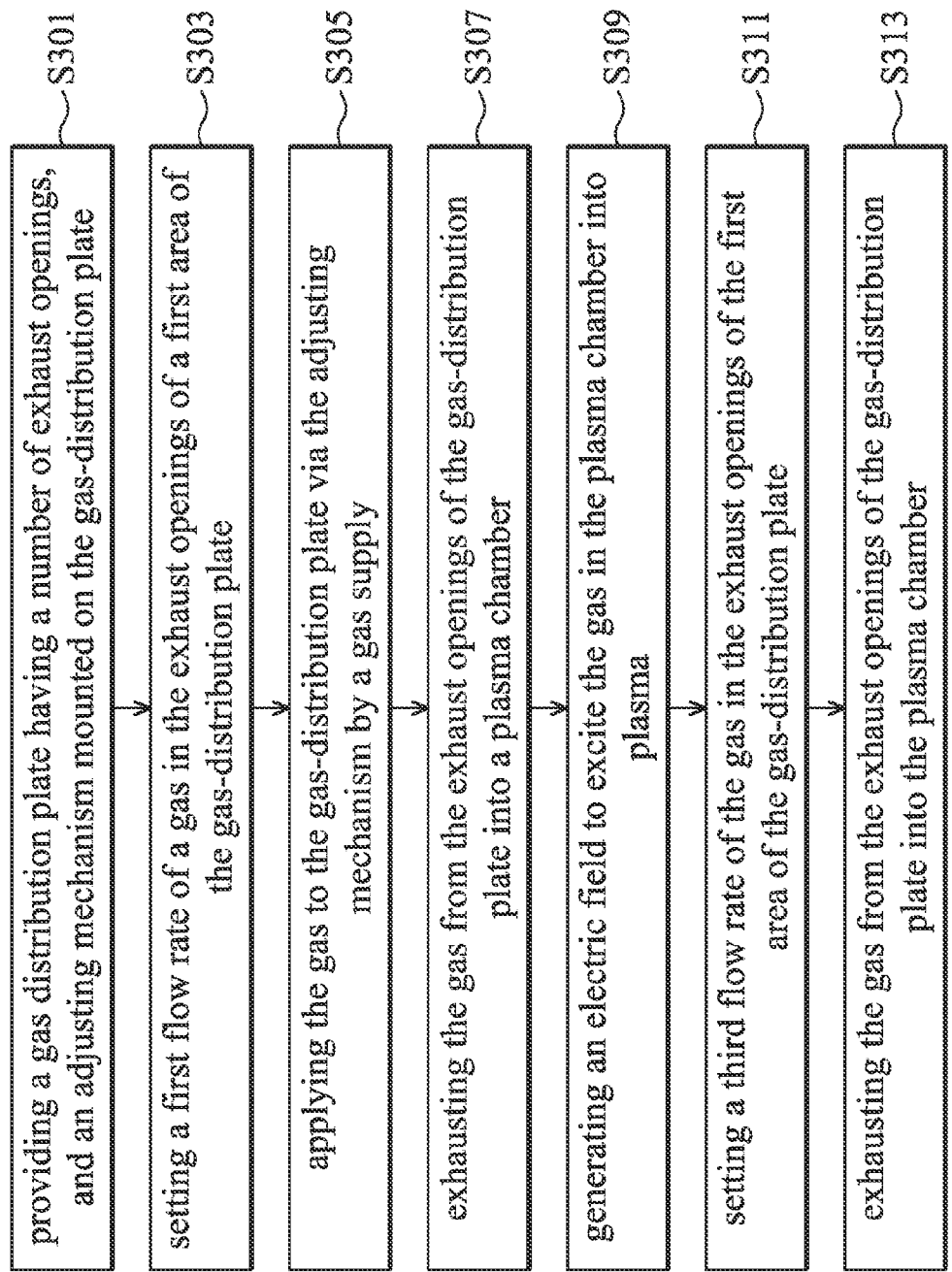
FIG. 9 is a flow chart of a gas-flow control method for the plasma apparatus in accordance with some embodiments of the disclosure.

FIG. 9 is a flow chart of a gas-flow control method for the plasma apparatus 1 in accordance with some embodiments of the disclosure. In step S301, the gas-distribution plate 30 is provided, and the adjusting mechanism 60 is mounted on the top surface 35 of the gas-distribution plate 30. In step S303, the valves 68 of the adjusting mechanism 60 are adjusted to set the flow rates of the gas in the exhaust openings 33 of each of the area Z4 of the gas-distribution plate 30.

In step S305, a plasma process is processed. The wafer W1 is disposed at the wafer chuck 20. The gas supply 40 applies the gas to the gas-distribution plate 30 via the adjusting mechanism 60. In step S307, the gas is exhausted from the exhaust openings 33 of the gas-distribution plate 30 into the plasma chamber 10.

In step S309, the power supply 50 is enabled. An electric field is generated by the wafer chuck 20 and the gas-distribution plate 30 (or the adjusting mechanism 60) to excite the gas in the plasma chamber 10 into plasma. Afterward, the wafer W1 is processed by the plasma.

In some embodiments, the distribution of the gas flow of the gas exhausted from the gas-distribution plate 30 can be adjusted during the plasma process. After a period of a processing time in step S309, the adjusting mechanism 60 can be adjusted during the plasma process.

In step S311, the flow rate of the gas exhausted from exhaust openings 33 in different areas Z42 of the gas-distribution plate 30 can be adjusted by using the adjusting mechanism 60. In some embodiments, as shown in FIG. 8, the flow rate of the gas exhausted from exhaust openings 33 in areas Z42 is adjusted by the valve 68b. Furthermore, the flow rate of each of the areas Z42 of the gas-distribution plate 30 can be changed using the adjusting mechanism 60.

In step S313, the flow rates of the gas exhausted from the exhaust openings 33 in some or all the areas Z4 are different from the flow rates of the gas exhausted from the exhaust openings 33 in step S307. For example, as shown in FIG. 1, the processing rate of an area Z12 different from the area Z11 of the wafer W1 is modified. The average thickness of the wafer W1 is improved further.

Embodiments of plasma apparatuses and gas-flow control methods for the plasma apparatus are provided. An adjusting mechanism is mounted on a gas-distribution to control the distribution of the flow rate of a gas exhausted from the gas-distribution plate. The processing rates of different areas of a wafer can be controlled. As a result, the yield rate of the wafer can be improved.

In some embodiments, a gas-flow control method for a plasma apparatus is provided. The gas-flow control method includes mounting a first adjusting mechanism on a gas-distribution plate. The gas-distribution plate includes a number of exhaust openings, and the exhaust openings in a first area of the gas-distribution plate are masked by the first adjusting mechanism. The gas-flow control method also includes exhausting a gas from the exhaust openings in a first unmasked area of the gas-distribution plate, and the gas passing through the first adjusting mechanism into a plasma chamber. The gas-flow control method further includes generating an electric field to excite the gas in the plasma chamber into plasma.

In some embodiments, a gas-flow control method for a plasma apparatus is provided. The gas-flow control method includes providing a gas-distribution plate having a plurality of exhaust openings, and an adjusting mechanism mounted on the gas-distribution plate. The gas-flow control method also includes masking the exhaust openings in a first area of the gas-distribution plate by adjusting the adjusting mechanism. The gas-flow control method further includes exhausting a gas from the exhaust openings in a first unmasked area of the gas-distribution plate into a plasma chamber, and generating an electric field to excite the gas in the plasma chamber into plasma.

In some embodiments, a gas-flow control method for a plasma apparatus is provided. The gas-flow control method includes providing a gas-distribution plate having a plurality of exhaust openings, and an adjusting mechanism disposed on the gas-distribution plate. The gas-flow control method also includes setting a first flow rate of a gas in the exhaust openings of a first area of the gas-distribution plate, and applying the gas to the gas-distribution plate via the adjusting mechanism by a gas supply. The gas-flow control method further includes exhausting the gas from the exhaust openings of the gas-distribution plate into a plasma chamber, and generating an electric field to excite the gas in the plasma chamber into plasma.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A gas-flow control method for a plasma apparatus, comprising:
    mounting a first adjusting mechanism on a gas-distribution plate, the first adjusting mechanism having a shaft, an elongate arm and a masking element, the shaft being detachably disposed on the gas-distribution plate, the arm extending outwardly from the shaft and being rotatable about the shaft, the masking element extending outwardly from the arm, wherein the gas-distribution plate comprises a plurality of exhaust openings;
    positioning the masking element such that the exhaust openings in a first area of the gas-distribution plate are masked by the masking element of the first adjusting mechanism;
    exhausting a gas from the exhaust openings in a first unmasked area of the gas-distribution plate, and the gas passing through the first adjusting mechanism into a plasma chamber; and
    generating an electric field to excite the gas in the plasma chamber into plasma.

2. The gas-flow control method as claimed in claim 1, comprising:
    detaching the first adjusting mechanism from the gas-distribution plate;
    mounting a second adjusting mechanism on the gas-distribution plate, wherein the exhaust openings in a second area of the gas-distribution plate are masked by the second adjusting mechanism; and
    exhausting the gas from the exhaust openings in a second unmasked area of the gas-distribution plate, and the gas passing through the second adjusting mechanism into the plasma chamber.

3. The gas-flow control method as claimed in claim 1, comprising disposing a wafer at a wafer chuck, wherein the first adjusting mechanism is located between the gas-distribution plate and the wafer chuck.

4. The gas-flow control method as claimed in claim 1, wherein the arm of the first adjusting mechanism is rotatable in a plane parallel to the gas-distribution plate and wherein positioning the masking element comprises rotating the arm.

5. The gas-flow control method as claimed in claim 4, wherein the masking element of the first adjusting mechanism is slidable along a length of the arm and wherein positioning the masking element comprises sliding the masking element relative to the arm.

6. A gas-flow control method for a plasma apparatus, comprising:
    providing a gas-distribution plate having a plurality of exhaust openings, and an adjusting mechanism mounted on the gas-distribution plate, the adjusting mechanism having a masking element, the masking element being rotatable about an axis parallel to the gas-distribution plate;
    masking the exhaust openings in a first area of the gas-distribution plate by adjusting a rotational position of the masking member of the adjusting mechanism;
    exhausting a gas from the exhaust openings in a first unmasked area of the gas-distribution plate into a plasma chamber; and
    generating an electric field to excite the gas in the plasma chamber into plasma.

7. The gas-flow control method as claimed in claim 6, comprising:
    masking the exhaust openings in a second area of the gas-distribution plate by adjusting the rotational position of the masking member of the adjusting mechanism; and
    exhausting the gas from the exhaust openings in a second unmasked area of the gas-distribution plate into the plasma chamber.

8. The gas-flow control method as claimed in claim 6, comprising disposing a wafer at a wafer chuck, wherein the adjusting mechanism is located between the gas-distribution plate and the wafer chuck.

9. The gas-flow control method as claimed in claim 6, wherein masking the exhaust openings in the first area of the gas-distribution plate further comprises adjusting a radial position of the masking element of the adjusting mechanism.

10. The gas-flow control method as claimed in claim 6, wherein, in masking the exhaust openings in the first area of the gas-distribution plate, the masking element is moved in a plane, which is parallel to the gas-distribution plate.

11. A gas-flow control method for a plasma apparatus, comprising:
    providing a gas-distribution plate having a plurality of exhaust openings, and an adjusting mechanism mounted on the gas-distribution plate, the adjusting mechanism having an elongate arm and a masking element, the arm being rotatable about an axis extending through the gas-distribution plate, the masking element extending outwardly from the arm:
    rotating the arm about the axis to position the masking element such that the exhaust openings in a first area of the gas-distribution plate are masked by the masking element;
    setting a first flow rate of a gas in the exhaust openings of a first area of the gas-distribution plate;
    applying the gas to the gas-distribution plate via the adjusting mechanism by a gas supply;
    exhausting the gas from the exhaust openings of the gas-distribution plate into a plasma chamber; and
    generating an electric field to excite the gas in the plasma chamber into plasma.

12. The gas-flow control method as claimed in claim 11, comprising:
    setting a third flow rate of the gas in the exhaust openings of the first area of the gas-distribution plate; and exhausting the gas from the exhaust openings of the gas-distribution plate into the plasma chamber.

13. The gas-flow control method as claimed in claim 11, comprising disposing a wafer at a wafer chuck, wherein the gas-distribution plate is located between the adjusting mechanism and the wafer chuck.

14. The gas-flow control method as claimed in claim 11, wherein the adjusting mechanism comprises a first sub-channel in communication with the exhaust openings of the first area and a first valve disposed at the first sub-channel, and the first valve is configured to adjust a first flow rate of the gas in the first sub-channel and the exhaust openings of the first area.

15. The gas-flow control method as claimed in claim 14, wherein the adjusting mechanism comprises a main channel in communication with the first sub-channel and the gas supply, and the gas flows into the gas-distribution plate via the main channel and the first sub-channel.

16. The gas-flow control method as claimed in claim 11, comprising:
    setting a second flow rate of the gas of the exhaust openings in a second area of the gas-distribution plate by adjusting the adjusting mechanism.

17. The gas-flow control method as claimed in claim 16, wherein the adjusting mechanism comprises a second sub-channel in communication with the exhaust openings of the second area and a second valve disposed at the second sub-channel, and the first valve is configured to adjust a first flow rate of the gas in the first sub-channel and the exhaust openings of the first area.

18. The gas-flow control method as claimed in claim 17, wherein the adjusting mechanism comprises a main channel in communication with the second sub-channel and the gas supply, and the gas flows into the gas-distribution plate via the main channel and the second sub-channel.

* * * * *